US009658306B2

United States Patent
Son et al.

(10) Patent No.: US 9,658,306 B2
(45) Date of Patent: May 23, 2017

(54) MAGNETIC RESONANCE IMAGING METHOD AND APPARATUS

(71) Applicant: Samsung Electronics Co., Ltd., Suwon-si (KR)

(72) Inventors: Jong-bum Son, Seongnam-si (KR); Seong-deok Lee, Seongnam-si (KR); Jaemock Yi, Hwaseong-si (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 720 days.

(21) Appl. No.: 14/074,038

(22) Filed: Nov. 7, 2013

(65) Prior Publication Data

US 2014/0152305 A1 Jun. 5, 2014

(30) Foreign Application Priority Data

Dec. 5, 2012 (KR) .................. 10-2012-0140513

(51) Int. Cl.
*G01R 33/56* (2006.01)
*G01R 33/565* (2006.01)

(52) U.S. Cl.
CPC .............. *G01R 33/56563* (2013.01)

(58) Field of Classification Search
CPC .......... G01R 33/6563; G01R 33/56563; G01R 33/583; G01R 33/3875; G01R 33/485; G01R 33/5602; G01R 33/5607; G01R 33/5611; G01R 33/5617; G01R 33/565; G01R 33/5659; A61B 5/055
See application file for complete search history.

(56) References Cited

U.S. PATENT DOCUMENTS

| | | | |
|---|---|---|---|
| 4,591,789 A | 5/1986 | Glover et al. | |
| 7,061,239 B2 | 6/2006 | McKendry et al. | |
| 2005/0248343 A1* | 11/2005 | Kruger | G01R 33/483 324/307 |
| 2007/0229070 A1* | 10/2007 | Miyazaki | G01N 24/08 324/307 |
| 2011/0050223 A1 | 3/2011 | Balcom et al. | |

FOREIGN PATENT DOCUMENTS

| | | |
|---|---|---|
| JP | 6-315471 A | 11/1994 |
| JP | 2005-152175 A | 6/2005 |
| JP | 2005-270327 A | 10/2005 |
| JP | 2009-018149 A | 1/2009 |
| WO | WO 2005/082244 A1 | 9/2005 |

\* cited by examiner

*Primary Examiner* — Clayton E Laballe
*Assistant Examiner* — Ruifeng Pu
(74) *Attorney, Agent, or Firm* — NSIP Law

(57) ABSTRACT

A magnetic resonance imaging (MRI) method and apparatus are provided including a signal acquirer, a resonance frequency acquirer, and an RF driver. The signal acquirer is configured to acquire a free induction decay (FID) signal or an echo signal to generate a magnetic resonance image of a portion of an area of a subject. The resonance frequency acquirer is configured to acquire a resonance frequency of the portion of the area from the acquired FID signal. The RF driver is configured to generate a refocusing RF pulse having the acquired resonance frequency. The signal acquirer, the resonance frequency acquirer and the RF driver are configured to acquire and generate in each of sections of an RF pulse sequence.

18 Claims, 5 Drawing Sheets

MAGNETIC RESONANCE IMAGING METHOD AND APPARATUS

CROSS-REFERENCE TO RELATED APPLICATIONS

This application claims the benefit under 35 U.S.C. §119(a) of Korean Patent Application No. 10-2012-0140513, filed on Dec. 5, 2012, in the Korean Intellectual Property Office, the disclosure of which is incorporated herein in its entirety by reference.

BACKGROUND

1. Field

The following description relates to a magnetic resonance imaging method and apparatus in which a resonance frequency of a portion of a predetermined area of a subject is acquired in each section, which corresponds to a repetition time (TR), of a pulse sequence, and the acquired resonance frequency is used to generate a magnetic resonance image of the subject.

2. Description of the Related Art

Magnetic resonance imaging (MRI) is a technique used to acquire an image of a subject by exposing atomic nuclei of the subject to a magnetic field and briefly turning on a radio frequency (RF) current produce a varying electromagnetic field having resonance frequency. Resonance of an atomic nucleus during MRI refers to a phenomenon in which high frequency energy is incident onto the atomic nucleus magnetized by the magnetic field, and the atomic nucleus in a low energy state is excited by absorbed high frequency energy. As a result, the atomic nucleus then reaches a high energy state. Atomic nuclei have different resonance frequencies according to the types thereof, and resonance is affected by the intensity of the magnetic field. The human body includes multitudinous atomic nuclei, such as $^{1}H$, $^{23}Na$, $^{31}P$, $^{13}C$, etc., which exhibit a magnetic resonance phenomenon. In general, a proton is used to generate a magnetic resonance image.

In response to a radio frequency (RF) pulse having high frequency energy is temporarily applied to a subject, a magnetic resonance signal is emitted from the subject. The magnetic resonance signal emitted from the subject may be classified according to a type of the RF pulse. Thus, a response to a general RF pulse is referred to as a free induction decay (FID), and a response to a refocusing RF pulse is referred to as an echo signal.

In existing MRI techniques to generate a magnetic resonance image of a predetermined area of a subject, the same resonance frequency is repeatedly used on an entire area of a subject to be imaged in each section of an RF pulse sequence.

SUMMARY

This Summary is provided to introduce a selection of concepts in a simplified form that are further described below in the Detailed Description. This Summary is not intended to identify key features or essential features of the claimed subject matter, nor is it intended to be used as an aid in determining the scope of the claimed subject matter.

In accordance with an illustrative example, there is provided a magnetic resonance imaging (MRI) method, including acquiring a resonance frequency of a portion of an area of a subject from a free induction decay (FID) signal; and applying a refocusing radio frequency (RF) pulse including the resonance frequency to acquire an echo signal to generate a magnetic resonance image of the portion of the area. The acquiring of the resonance frequency and the applying of the refocusing RF pulse are performed in each of sections of an RF pulse sequence.

The method may include applying an excitation RF pulse to acquire the FID signal, wherein the excitation RF pulse of a next section of each of the sections has the resonance frequency acquired in each of the sections of the RF pulse sequence.

Two refocusing RF pulses of each of the sections of the RF pulse sequence may have the resonance frequency acquired in each of the sections of the RF pulse sequence.

The acquiring of the resonance frequency may be performed in real-time.

The acquiring of the resonance frequency may include acquiring the FID signal of the portion of the area in response to an applied excitation RF pulse; performing Fourier Transform of the acquired FID signal, determining a frequency having a peak value from a frequency spectrum of the acquired FID signal according to the Fourier Transform, and acquiring the determined frequency having the peak value as the resonance frequency of the portion of the area.

The method may configure the RF pulse sequence to be a spin echo or a fast spin echo. The method may also configure the excitation RF pulse to acquire the FID signal to be a 90° RF pulse, and the refocusing RF pulse to be 180° RF pulse. The method may also include configuring the predetermined area to be a 2-dimensional (2D) cross-section of the subject or a 3-dimensional (3D) sub-volume.

In accordance with an illustrative example, there is provided a computer program embodied on a non-transitory computer readable medium, the computer program being configured to control a processor to perform the MRI method described above.

In accordance with an illustrative example, there is provided a magnetic resonance imaging (MRI) apparatus, including a signal acquirer configured to acquire a free induction decay (FID) signal or an echo signal to generate a magnetic resonance image of a portion of an area of a subject; a resonance frequency acquirer configured to acquire a resonance frequency of the portion of the area from the acquired FID signal; and an RF driver configured to generate a refocusing RF pulse having the acquired resonance frequency. The signal acquirer, the resonance frequency acquirer and the RF driver are configured to acquire and generate in each of sections of an RF pulse sequence.

The RF driver may use the acquired resonance frequency to generate an excitation RF pulse of a next section of each of the sections.

The RF driver may use the resonance frequency acquired in each of the sections to generate at least two refocusing RF pulses of each of the sections.

The resonance frequency acquirer may acquire the resonance frequency in real-time.

The resonance frequency acquirer may also include a converter configured to perform Fourier Transform of the acquired FID signal, a determiner configured to determine a frequency having a peak value from a frequency spectrum of the acquired FID signal according to the Fourier Transform to acquire the resonance frequency of the portion of the area, and a storage configured to store the acquired FID signal and the acquired resonance frequency.

The RF pulse sequence may be a spin echo or a fast spin echo.

An excitation RF pulse may acquire the FID signal a 90° RF pulse, and the refocusing RF pulse may be 180° RF pulse.

The predetermined area may be a 2D cross-section of the subject or a 3D sub volume.

BRIEF DESCRIPTION OF THE DRAWINGS

These and/or other aspects will become apparent and more readily appreciated from the following description of the embodiments, taken in conjunction with the accompanying drawings of which.

Figure 1:
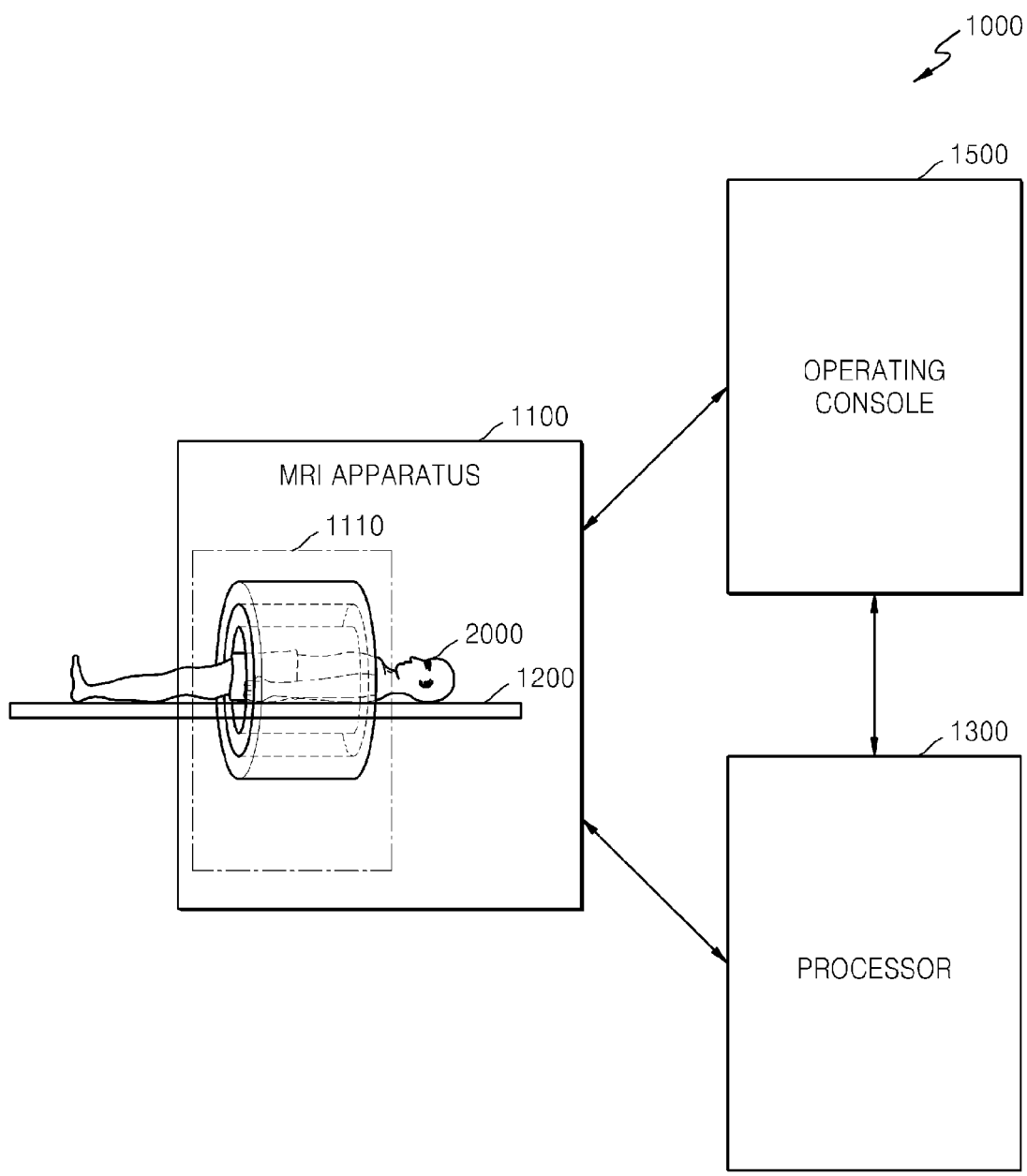
FIG. 1 is a schematic view of a magnetic resonance imaging (MRI) system, according to an embodiment.

Throughout the drawings and the detailed description, unless otherwise described, the same drawing reference numerals will be understood to refer to the same elements, features, and structures. The relative size and depiction of these elements may be exaggerated for clarity, illustration, and convenience.

DETAILED DESCRIPTION

Reference will now be made in detail to embodiments, examples of which are illustrated in the accompanying drawings, wherein like reference numerals refer to the like elements throughout. In this regard, the present embodiments may have different forms and should not be construed as being limited to the descriptions set forth herein. Accordingly, the embodiments are merely described below, by referring to the figures, to explain aspects of the present description The present exemplary embodiments relate to a magnetic resonance imaging (MRI) method and apparatus. Descriptions of details well-known to one of ordinary skill in the art to which the present disclosure pertains are omitted.

It will be understood that when an element or layer is referred to as being "on" or "connected to" another element or layer, it can be directly on or connected to the other element or layer or through intervening elements or layers may be present. In contrast, when an element is referred to as being "directly on" or "directly connected to" another element or layer, there are no intervening elements or layers present. Like reference numerals refer to like elements throughout.

FIG. 1 is a schematic view of a magnetic resonance imaging (MRI) system 1000 according to one or more embodiments. The MRI system 1000 includes an MRI apparatus 1100, a processor 1300, and an operating console 1500. In an alternative configuration, one or both of the operating console 1500 and the processor 1300 may be part of the MRI apparatus 1100.

The MRI apparatus 1100 receives from the operating console 1500 a control signal to generate a magnetic resonance image and operates according to the control signal. The MRI apparatus 1100 acquires a magnetic resonance signal from a subject 2000 located on a table 1200 of the MRI apparatus 1110 to generate the magnetic resonance image. The subject 2000 may be a person, an animal, a living organism, or an object. The MRI apparatus 1100 outputs an image signal generated from the magnetic resonance signal to the processor 1300.

The processor 1300 receives the image signal from the MRI apparatus 1100, re-processes the image signal to generate the magnetic resonance image of the entire subject 2000 or a predetermined area of the subject 2000, and transmits the generated magnetic resonance image to the operating console 1500. The predetermined area of the subject 2000 may be an area or portion of the subject 2000 a user selected through the operating console 1500 to be scanned and from which the magnetic resonance image is generated. The processor 1300 includes an image processor (not shown), a storage (not shown), and an interface (not shown). The image processor re-processes the image signal generated from the magnetic resonance signal to generate the magnetic resonance image. The storage stores the image signal and the generated magnetic resonance image. The interface connects the MRI apparatus 110 and the operating console 1500 to each other.

The operating console 1500 includes a monitor (not shown), various types of input devices (not shown) such as a keyboard, a mouse, etc., and a panel (not shown). The monitor receives the generated magnetic resonance image from the processor 1300 and displays the generated magnetic resonance image. The various types of input devices receive control information, etc., from a user, and the panel displays a scan condition and a scan state.

Figure 2:
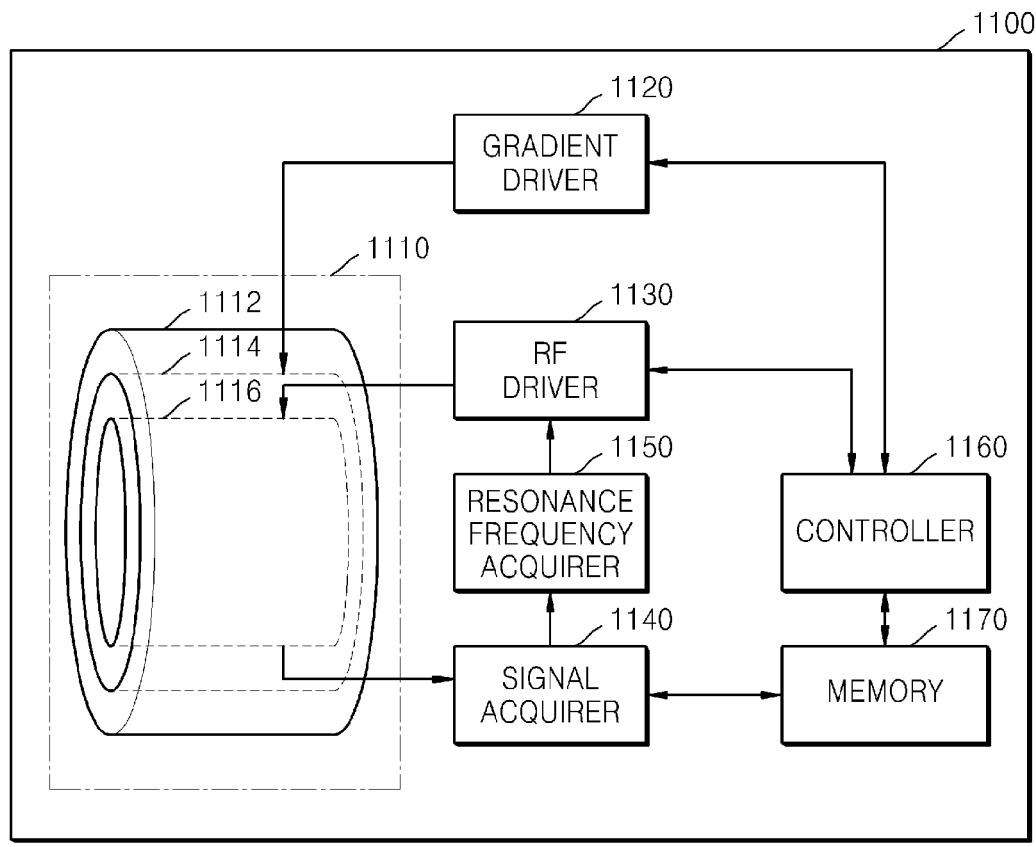
FIG. 2 is a block diagram of an MIR apparatus of the MRI system of FIG. 1, according to an embodiment.

FIG. 2 is a view of the MIR apparatus 1100 of the MRI system 1000, in accord with an illustrative example. For ease of description, various structural elements are shown in FIG. 2 to describe the MRI system 1000. However, it can be appreciated that these structural elements may be combined as a single structural element or additional structural elements. The MRI apparatus 1100 applies a magnetic field and a high frequency current to the subject 2000 and acquires the magnetic resonance signal emitted from the subject 2000 in response to the magnetic field and the high frequency current. The MRI apparatus 1100 includes a magnet system 1110, a gradient driver 1120, a radio frequency (RF) driver 1130, a signal acquirer 1140, a resonance frequency acquirer 1150, a controller 1160, and a memory 170. The magnetic system 1110 includes a main magnet 1112, a gradient coil 1114, and an RF coil 1116.

The main magnet 1112 forms a static magnetic field in an internal space of the magnetic system 1110. A direction of the static magnetic field may be parallel to or perpendicular to a body axis or a main axis of the subject 2000, i.e., a longitudinal direction. A permanent magnet, a resistive magnet, a super conductive magnet, or the like may be used as the main magnet 1112. For the convenience of description, it is assumed that the main magnet 1112 is a super conductive magnet that forms a horizontal static magnetic field parallel with the body axis of the subject 2000. In this case, the main magnet 1112, the gradient coil 1114, and the RF coil 1116 are arranged with respect to a same central axis as shown in FIG. 2. The main magnet 1112, the gradient coil 1114, and the RF coil 1116 are arranged from outer most to inner most layers. An inside space of the RF coil 1116 is empty to locate the subject 2000 therein. The subject 2000 is located on a table 1200, and the table 1200 is moved into the magnetic system 1110 to apply a magnetic field and an RF pulse to the subject 2000.

A proton has a magnetic moment, i.e., a magnetic dipole moment, due to a spin motion. When there is no external magnetic field, the magnetic moment of the proton is aligned in a random direction, without a regular rule. However, when the proton is placed in a static magnetic field, hydrogen atoms are arranged in a direction for the static magnetic field to go into a low energy state. The proton has a Larmor frequency of 42.58 MHz in a magnetic field of 1.0 Tesla. If electromagnetic waves corresponding to a Larmor frequency are applied to atomic nucleuses, the atomic nucleuses transit from low energy states to high energy states.

The gradient coil 1114 forms a gradient field around the subject 2000 defined by three axes perpendicular to each other. When an RF pulse having a Larmor frequency is applied to the subject 2000 around which the static magnetic field is formed, magnetic resonance signals from tissues having similar properties are simultaneously emitted. Therefore, the kind of signal that is emitted and the position where the signal is emitted are not known. A gradient magnetic field is used to solve this problem. The proton in a predetermined area of the subject 2000 corresponding to an area of interest may selectively resonate using the gradient magnetic field in which a distribution of a magnetic field and a Larmor frequency linearly vary according to space. The three axes perpendicular to each other respectively are a slice axis, a frequency axis, and a phase axis. When three coordinate axes perpendicular to each other in an internal space in which the static magnetic field is formed are, respectively, x, y, and z, any one of x, y, and z may be the slice axis. In one example, one of the other two axes is the frequency axis, and the other one is the phase axis. The slice axis may be set in a direction inclined at a particular angle with respect to the body axis of the subject 2000, i.e., the longitudinal direction.

The gradient coil 1114 may form three types of gradient magnetic fields along the x, y, and z axes of the subject 2000. The gradient magnetic field is formed along the body axis of the subject 2000 as a condition to selectively excite a particular cross-section perpendicular to the body axis of the subject 2000. In one example, the gradient coil 114 applies a slice selection gradient. Also, the gradient coil 114 applies a frequency encoding gradient and a phase encoding gradient to acquire 2-dimensional (2D) space information in a selected plane. As described above, the gradient coil 1114 has three types of gradient coils to form a gradient field along the slice axis, the frequency axis, and the phase axis.

The RF coil 1116 applies an RF pulse to acquire the magnetic resonance signal from the subject 2000. The RF coil 1116 also acquires the magnetic resonance signal emitted from the subject in response to the applied RF pulse. In other words, the RF coil 1116 has a function of transmitting the RF pulse and a function of receiving the magnetic resonance signal. The RF coil 1116 may apply several types of RF pulses to the subject 2000. For example, the several types of RF pulses may be an excitation RF pulse and a refocusing RF pulse which may be respectively a 90° RF pulse and a 180° RF pulse. The RF coil 1116 may also apply various types of RF pulse sequences including a plurality of RF pulses, for instance, a spin echo or a fast spin echo, to the subject 2000.

The gradient driver 1120 is operatively connected to the gradient coil 1114 and outputs a signal related to the formation of the gradient field to the gradient coil 1114. The gradient driver 1120 includes gradient driving circuits, each corresponding to one of three types of gradient coils for the slice, frequency, and phase axes. The gradient driver 1120 may include a waveform synthesizer (not shown) and an RF amplifier (not shown).

The RF driver 1130 is operatively connected to the RF coil 1116, generates an RF pulse and an RF pulse sequence, and outputs the RF pulse and the RF pulse sequence to the RF coil 1116. The RF driver 1130 includes an RF oscillator (not shown), a phase shifter (not shown), a waveform synthesizer (not shown), a modulator (not shown), and an RF amplifier (not shown). The RF oscillator oscillates the RF pulse, the phase shifter shifts a phase, and the waveform synthesizer forms an appropriate type of RF pulse sequence for the RF coil 1116. The modulator modulates the RF pulse sequence, and the RF amplifier amplifies RF pulses.

The signal acquirer 1140 is operatively connected to the RF coil 1116, acquires the magnetic resonance signal received through the RF coil 1116, demodulates and filters the magnetic resonance signal, and processes the magnetic resonance signal into digital data. The acquired magnetic resonance signal may be a free induction decay (FID) signal generated in response to the excitation RF pulse or an echo generated in response to the refocusing RF pulse. The signal acquirer 1140 may include a preamplifier (not shown), a demodulator (not shown), a low pass filter (LPF), and an analog-to-digital converter (ADC) (not shown). The preamplifier amplifies the received magnetic resonance signal, and the demodulator demodulates the amplified magnetic resonance signal. The LFP removes noise from the magnetic resonance signal, and the ADC converts a demodulated analog signal into a digital signal.

The magnetic resonance signal converted into the digital signal is stored in the memory 1170. An array processor (not shown) performs Fourier Transform on the digital signal obtained from the magnetic resonance signal and generates and transmits an image signal to the processor 1300.

The RF driver 1130 and the signal acquirer 1140 may be integrated in a transceiver.

The resonance frequency acquirer 1150 receives the FID signal from the signal acquirer 1140, acquires a resonance frequency of an RF pulse to be applied from the RF coil 1116, and transmits the resonance frequency to the RF driver 1130 so that the RF driver 1130 generates the RF pulse or the RF pulse sequence. The resonance frequency acquirer 1150 will now be described in more detail with reference to FIG. 3.

Figure 3:
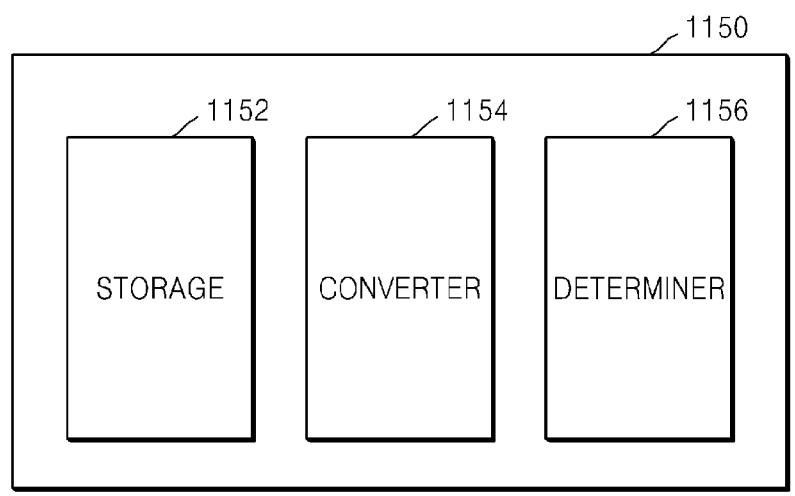
FIG. 3 is a block diagram of a resonance frequency acquirer of the MRI apparatus of FIG. 2, according to an embodiment.

FIG. 3 is a block diagram of the resonance frequency acquirer 1150, in accordance with an embodiment. Referring to FIG. 3, the resonance frequency acquirer 1150 includes a storage 1152, a converter 1154, and a determiner 1156. The resonance frequency acquirer 1150 acquires a resonance frequency of a part of an area from the subject 2000 a user desires to examine in real-time in each section of the RF pulse sequence, corresponding to a TR. In one example, the area refers to a 2D cross-section of a desired area from the subject 2000 or a 3-dimensional (3D) sub-volume of the desired area from the subject 2000. A FID signal, emitted from the subject 2000 in response to the excitation RF pulse, is not used in a conventional MRI method. However, in the present configuration, the FID signal is used to acquire a resonance frequency of the desired area of the subject 200. Also, the acquired resonance frequency is used to generate the RF pulse to be applied to the subject 2000. Therefore, non-uniformity of a static magnetic field may be compensated with respect to each portion, scanned from each section of the RF pulse sequence, of the area from the subject 2000. Also, a signal-to-nose ratio (SNR) improves and an image distortion caused by the non-uniform static magnetic field is reduced.

The storage 1152 receives and stores the FID signal of the part of the predetermined area from the subject 2000. The FID signal is acquired by the signal acquirer 1140 from each section corresponding to the TR of the RF pulse sequence. The storage 1152 also stores the resonance frequency of the portion of the area from the subject 2000. The resonance frequency is acquired by the resonance frequency acquirer 1150 from each section corresponding to the TR of the RF pulse sequence. The stored resonance frequency may be used to generate at least one refocusing RF pulse of each section or an excitation RF pulse belonging to a next section. The storage 1152 may be high-speed memory to process a signal in real-time.

The converter 1154 performs Fourier Transform with respect to the FID signal of the part of the area desired to be examined from the subject 2000 to generate a frequency spectrum of the FID signal.

The determiner 1156 determines a frequency having a peak value from the determined frequency spectrum of the FID signal of the part of the area desired to be examined from the subject 2000 and acquires the determined frequency as the resonance frequency of the part of the predetermined area.

Referring to FIG. 2 again, the controller 1160 controls the gradient driver 1120, the RF driver 1130, the memory 1170, the signal acquired 1140, and the resonance frequency acquirer 1150 of the MRI apparatus 1100 to acquire the magnetic resonance signal. The controller 1160 receives the control signal from the operating console 1500 to control the MRI apparatus 1100. The controller 1160 may store various types of data related to using a program for an operation of the controller 1160, the RF pulse, and the RF pulse sequence in the memory 1170.

The MRI apparatus 1100, the operating console, and the processor 1300 described herein may be implemented using hardware components. Also, the gradient driver 1120, the magnetic system 1110, the RF driver 1130, the resonance frequency acquirer 1150, the signal acquirer 1140, the controller 1160, and the memory 1170 described herein may be implemented using hardware components. The hardware components may include, for example, controllers, sensors, processors, generators, drivers, and other equivalent electronic components. The hardware components may be implemented using one or more general-purpose or special purpose computers, such as, for example, a processor, a controller and an arithmetic logic unit, a digital signal processor, a microcomputer, a field programmable array, a programmable logic unit, a microprocessor or any other device capable of responding to and executing instructions in a defined manner. The hardware components may run an operating system (OS) and one or more software applications that run on the OS. The hardware components also may access, store, manipulate, process, and create data in response to execution of the software. For purpose of simplicity, the description of a processing device is used as singular; however, one skilled in the art will appreciated that a processing device may include multiple processing elements and multiple types of processing elements. For example, a hardware component may include multiple processors or a processor and a controller. In addition, different processing configurations are possible, such a parallel processors.

Figure 4:
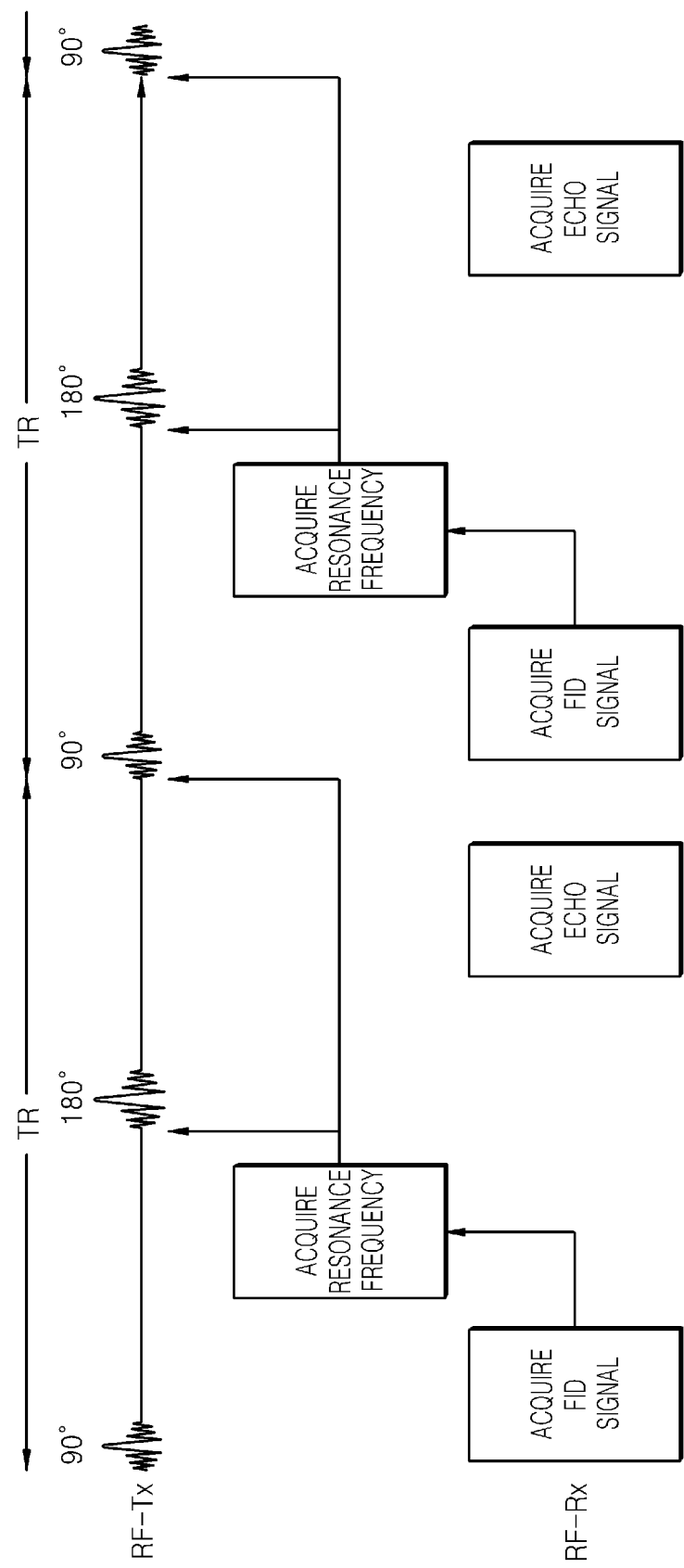
FIG. 4 is a view illustrating a method to acquire a resonance frequency of a portion of a subject to generate a radio frequency (RF) pulse, according to an embodiment.

FIG. 4 is a view illustrating a process to acquire a resonance frequency of a portion of an area desired to be examined from a subject in each section corresponding to a repetition time (TR) of an RF pulse sequence. The acquired resonance frequency is used to generate an RF pulse. The TR refers to an elapsed time from a time when one excitation RF pulse is applied to a time when a next excitation RF pulse is applied. An RF pulse sequence applied to the area to generate a magnetic resonance image of the area of the subject 2000 may be divided into a plurality of sections corresponding to the TR. Referring to FIG. 4, a plurality of TRs may exist in the RF pulse sequence.

The RF pulse sequence is applied to generate a magnetic resonance image of the entire portion of the area of the subject 2000. Each of the sections of the RF pulse sequence is applied to generate the magnetic resonance image of the each part of the area of the subject 2000. In other words, an echo signal for imaging each portion of the area of the subject 2000 is acquired from each section corresponding to the TR of the RF pulse sequence. Thus, a k-space scan line signal corresponding to one line on a k-space used in MRI field is acquired using the echo signal. In the MR field, the k-space of the area of the subject is formed using echo signals. To form the k-space of the area from the subject 2000, the area of the subject to generate magnetic resonance image is defined and an echo signal having position information and contrast information of the area is acquired.

The area desired to be examined from the subject 2000 may be a 2D plane or a 3D sub volume. For the convenience of description, the area of the subject 2000 is a 2D plane. If a slice selection gradient is applied to form a gradient field along the z axis, the xy plane perpendicular to the z axis may be selected. A frequency encoding gradient and a phase encoding gradient are applied to acquire 2D position information of the selected 2D plane. In one section of the RF pulse sequence corresponding to the TR, a particular phase difference is generated along the y axis in a magnetic dipole moment of atomic nuclei in a selected slice plane using the phase encoding gradient. A particular frequency difference is generated along the x axis at any position on the y axis using the frequency encoding gradient to acquire an echo signal. Therefore, an echo signal with respect to a part of the area of the subject 2000, i.e., a k-space scan line corresponding to one line on the k-space, is acquired. In each of the other sections of the RF pulse sequence, a particular frequency difference is generated along the x axis in another position of the y axis by using the phase encoding gradient and the frequency encoding gradient to acquire an echo signal. As a result, echo signals of the entire portion of the area of the subject 2000 are acquired. If the echo signals of the entire portion of the area are used, scan lines of the entire portion of the k-space are uniformly acquired.

In FIG. 4, RF-Tx denotes a side of the RF coil 1116 transmitting an RF pulse, and RF-Rx denotes a side of the RF coil 1116 receiving a magnetic resonance signal such as an FID signal or an echo signal. Each TR in an RF pulse sequence shown in FIG. 4 will now be described. One excitation RF pulse and one refocusing RF pulse sequentially exist in each section corresponding to a TR. The RF pulse is a 90° RF pulse, and the refocusing RF pulse is a 180° RF pulse. Differently from FIG. 4, multi-refocusing RF pulses may exist instead of one refocusing RF pulse. The RF pulse sequence is a spin echo in FIG. 4, but the embodiment is not limited thereto. Therefore, various types of pulse sequences such as a fast spin echo may be applied.

In a section corresponding to a first TR, an excitation RF pulse as a 90° RF pulse is applied to the area desired to be examined from the subject 2000 at the RF-Tx of the RF coil 1116. In response to the excitation RF pulse, the FID signal of the part of the area of the subject 2000 is emitted, and the RF-Rx of the RF coil 1116 receives the FID signal and transmits the FID signal to the signal acquirer 1140. The signal acquirer 1140 acquires the FID signal and transmits the FID signal to the resonance frequency acquirer 1150. The resonance frequency acquirer 1150 acquires a resonance frequency of the portion of the area using the FID signal of the portion of the area of the subject 2000. The resonance frequency of the portion of the area acquired by the resonance frequency acquirer 1150 is transmitted to the RF driver 1130 and used to generate the refocusing RF pulse as the 180° RF pulse applied, after the excitation RF pulse is applied. Therefore, the refocusing RF pulse applied to acquire the echo signal of the portion of the area may have a resonance frequency to compensate for non-uniformity of a static magnetic field of the part of the predetermined area in real time.

Even in a section corresponding to a second TR, according to the process of FIG. 4, a resonance frequency of another portion of the area desired to be examined of the subject 2000 may be acquired, and a refocusing RF pulse having the acquired resonance frequency may be applied.

The resonance frequency acquired in the section corresponding to the first TR may be used not only to generate at least one refocusing RF pulse in the same section, but also to generate an excitation RF pulse in a next section corresponding to the second TR. As shown in FIG. 4, a resonance frequency acquired in each section corresponding to a TR may be used to generate a refocusing RF pulse as a 180° RF pulse belonging to each of the same section and to generate an excitation RF pulse as a 90° RF pulse in a next section of the each section.

Figure 5:
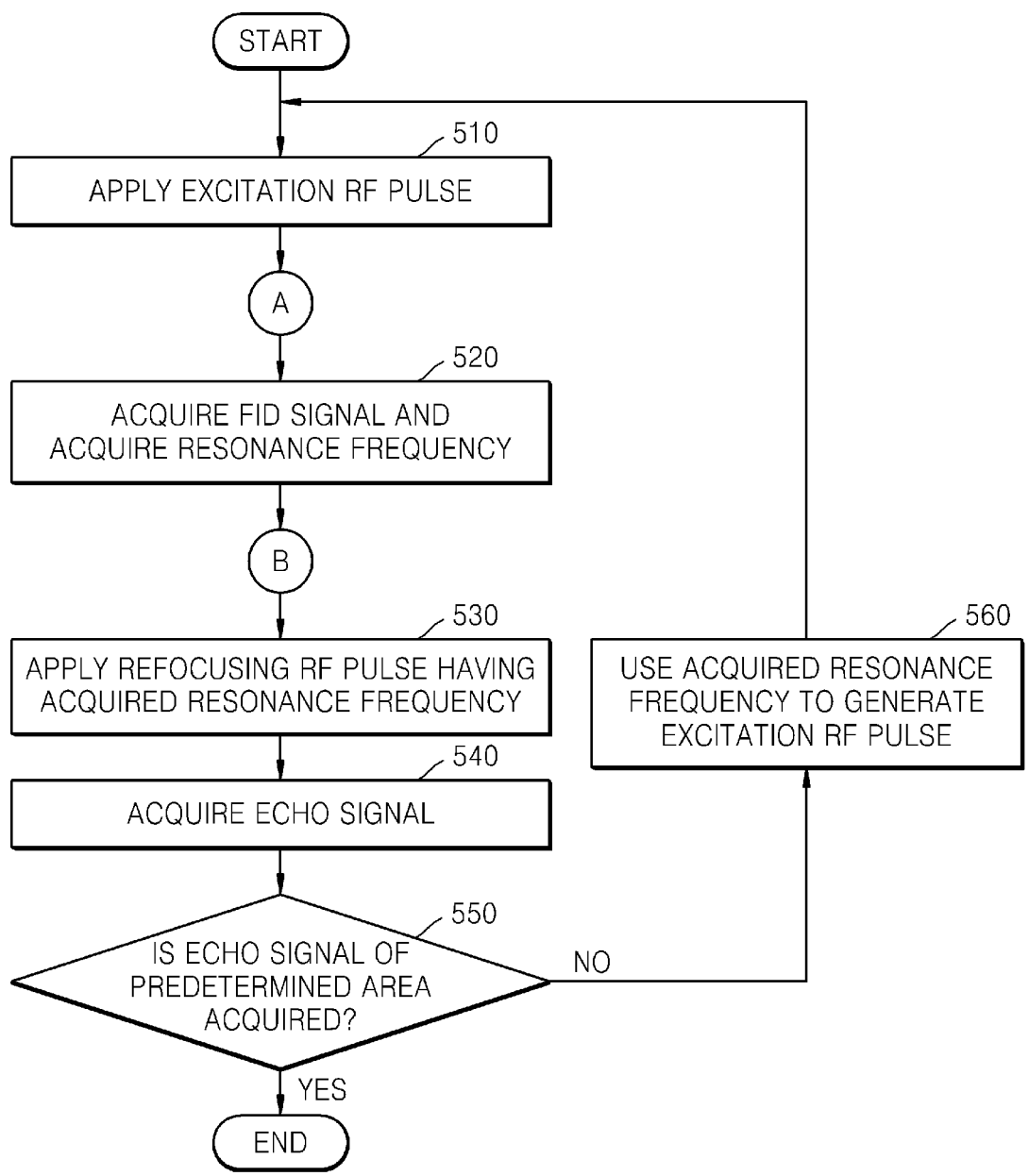
FIG. 5 is a flowchart of an MRI method, according to an embodiment.

FIG. 5 is a flowchart of an MRI method, according to an embodiment. Operations 510 through 540 are performed in each section of an RF pulse sequence corresponding to a TR.

In operation 510, the method applies an excitation RF pulse, through the RF coil 1116, to an area of the subject 2000.

In operation 520, the method acquires, through the signal acquirer 1140, an FID signal from a portion of the area of the subject 2000 in response to the excitation RF pulse, and acquires, through the resonance frequency acquirer 1150, a resonance frequency from the portion of the area of the subject 2000 from the acquired FID signal. Operation 520 will now be described in more detail with reference to FIG. 6.

Figure 6:
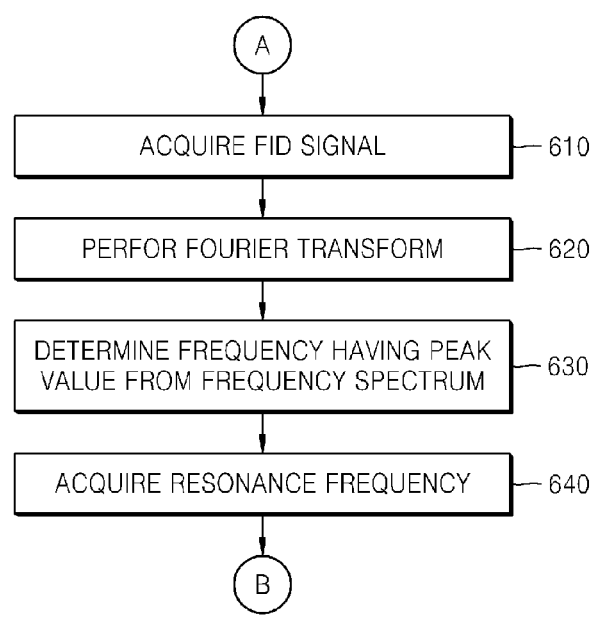
FIG. 6 is a flowchart of an operation to acquire a free induction decay (FID) signal and a resonance frequency, according to an embodiment.

FIG. 6 is a flowchart of an operation to acquire an FID signal and a resonance frequency, in accordance with an embodiment.

In operation 610, the method applies, through the RF coil 1116, the excitation RF pulse and receives the FID signal of the portion of the area of the subject 2000 in response to the excitation RF pulse. The method also acquires, through the signal acquirer 1140, the received FID signal. The method transmits the acquired FID signal to the resonance frequency acquirer 1150.

In operation 620, the method, through the converter 1154 of the resonance frequency acquirer 1150, performs Fourier Transform with respect to the FID signal of the portion of the area of the subject 2000. As a result, the method generates a frequency spectrum of the FID signal based on the Fourier Transform.

In operation 630, the method, through the determiner 1156 of the resonance frequency acquirer 1150, determines a frequency having a peak value from the frequency spectrum of the FID signal generated according to the Fourier Transform.

In operation 640, the method, through the determiner 1156 of the resonance frequency acquirer 1150, acquires the determined frequency as the resonance frequency of the portion of the area. The method may store the acquired resonance frequency in the storage 1152 of the resonance frequency acquirer 1150.

Referring to FIG. 5, in operation 530, the method, through the RF driver 1130, generates a refocusing RF pulse at the resonance frequency acquired, and applies, through the RF coil 1116, the generated refocusing RF pulse to the area of the subject 2000.

In operation 540, the method, through the signal acquirer 1140, acquires an echo signal of the portion of the area of the subject 2000 in response to the applied refocusing RF pulse.

In operation 550, the method determines whether an echo signal of the entire portion of the area of the subject 2000 is acquired. In other words, determines whether operations 510 through 540 were performed to all sections of the RF pulse sequence.

If an RF pulse sequence is completely applied to generate a magnetic resonance image to acquire echo signals of the predetermined area of the subject 2000, the method determines that all processes to acquire the magnetic resonance image are completed. If not all echo signals of the area of the subject 2000 are acquired, operation 560 is performed.

In operation 560, the method uses the acquired resonance frequency to generate an excitation RF pulse in a next section, corresponding to a next TR, of the RF pulse sequence. In other words, a resonance frequency acquired in any section, corresponding to a TR, of the RF pulse sequence may be used to generate a refocusing RF pulse in the same section and to generate an excitation RF pulse in a next section.

As described above, according to the various embodiments described above, distortion of a magnetic resonance image caused by non-uniformity of a static magnetic field is reduced.

Program instructions to perform the methods of FIGS. 5 and 6 described herein, or one or more operations thereof, may be recorded, stored, or fixed in one or more non-transitory computer-readable storage media. The program instructions may be implemented by a computer. For example, the computer may cause a processor to execute the program instructions. The non-transitory computer-readable storage media may include, alone or in combination with the program instructions, data files, data structures, and the like. Examples of the non-transitory computer-readable media include magnetic media, such as hard disks, floppy disks, and magnetic tape; optical media such as CD ROM disks and DVDs; magneto-optical media, such as optical disks; and hardware devices that are specially configured to store and perform program instructions, such as read-only memory (ROM), random access memory (RAM), flash memory, and the like. Examples of program instructions include machine code, such as produced by a compiler, and files containing higher level code that may be executed by the computer using an interpreter. The program instructions, that is, software, may be distributed over network coupled computer systems so that the software is stored and executed in a distributed fashion. For example, the software and data may be stored by one or more computer readable recording mediums. Also, functional programs, codes, and code segments for accomplishing the example embodiments disclosed herein can be easily construed by programmers skilled in the art to which the embodiments pertain based on and using the flow diagrams and block diagrams of the figures and their corresponding descriptions as provided herein.

While the present disclosure has been particularly shown and described with reference to exemplary embodiments thereof, it will be understood by those skilled in the art that various changes in form and details may be made therein without departing from the spirit and scope of the invention as defined by the appended claims. The preferred embodiments should be considered in descriptive sense only and not for purposes of limitation. Therefore, the scope of the present disclosure is defined not by the detailed description of the invention but by the appended claims, and all differences within the scope will be construed as being included in the present disclosure.

What is claimed is:

1. A magnetic resonance imaging (MRI) method, comprising:
    acquiring a resonance frequency of a portion of an area of a subject from a free induction decay (FID) signal by performing a transform of the acquired FID signal and determining a frequency with a peak value according to the transform; and
    applying a refocusing radio frequency (RF) pulse comprising the resonance frequency to acquire an echo signal to generate a magnetic resonance image of the portion of the area,
    wherein the acquiring of the resonance frequency and the applying of the refocusing RF pulse are performed in each of sections, corresponding to a repetition time, of an RF pulse sequence, and wherein the resonance frequency is used to generate the refocusing RF pulse in a same section and to generate an excitation RF pulse in a next section, the next section corresponding to a next repetition time.

2. The MRI method as recited in claim 1, further comprising:
    applying an excitation RF pulse to acquire the FID signal, wherein the excitation RF pulse of a next section of each of the sections has the resonance frequency acquired in each of the sections of the RF pulse sequence.

3. The MRI method as recited in claim 1, wherein two refocusing RF pulses of each of the sections of the RF pulse sequence have the resonance frequency acquired in each of the sections of the RF pulse sequence.

4. The MRI method as recited in claim 1, wherein the acquiring of the resonance frequency is performed in real-time.

5. The MRI method as recited in claim 1, wherein the acquiring of the resonance frequency comprises:
    acquiring the FID signal of the portion of the area in response to an applied excitation RF pulse,
    performing Fourier Transform of the acquired FID signal,
    determining a frequency having a peak value from a frequency spectrum of the acquired FID signal according to the Fourier Transform, and
    acquiring the determined frequency having the peak value as the resonance frequency of the portion of the area.

6. The MRI method as recited in claim 1, further comprising:
    configuring the RF pulse sequence to be a spin echo or a fast spin echo.

7. The MRI method as recited in claim 1, further comprising:
    configuring an excitation RF pulse to acquire the FID signal to be a 90° RF pulse, and the refocusing RF pulse to be 180° RF pulse.

8. The MRI method as recited in claim 1, further comprising:
    configuring the predetermined area to be a 2-dimensional (2D) cross-section of the subject or a 3-dimensional (3D) sub-volume.

9. A computer program embodied on a non-transitory computer readable medium, the computer program being configured to control a processor to perform the MRI method of claim 1.

10. A magnetic resonance imaging (MRI) apparatus, comprising:
    a signal acquirer configured to acquire a free induction decay (FID) signal or an echo signal to generate a magnetic resonance image of a portion of an area of a subject;
    a resonance frequency acquirer configured to acquire a resonance frequency of the portion of the area from the acquired FID signal by performing a transform of the acquired FID signal and determining a frequency with a peak value according to the transform; and
    an RF driver configured to generate a refocusing RF pulse having the acquired resonance frequency,
    wherein the signal acquirer, the resonance frequency acquirer and the RF driver are configured to acquire and generate in each of sections, corresponding to a repetition time, of an RF pulse sequence, and wherein the resonance frequency is used to generate the refocusing RF pulse in a same section and to generate an excitation RF pulse in a next section, the next section corresponding to a next repetition time.

11. The MRI apparatus as recited in claim 10, wherein the RF driver uses the acquired resonance frequency to generate an excitation RF pulse of a next section of each of the sections.

12. The MRI apparatus as recited in claim 10, wherein the RF driver uses the resonance frequency acquired in each of the sections to generate at least two refocusing RF pulses of each of the sections.

13. The MRI apparatus as recited in claim 10, wherein the resonance frequency acquirer acquires the resonance frequency in real-time.

14. The MRI apparatus as recited in claim 10, wherein the resonance frequency acquirer comprises:
    a converter configured to perform Fourier Transform of the acquired FID signal,
    a determiner configured to determine a frequency having a peak value from a frequency spectrum of the acquired FID signal according to the Fourier Transform to acquire the resonance frequency of the portion of the area, and
    a storage configured to store the acquired FID signal and the acquired resonance frequency.

15. The MRI apparatus as recited in claim 10, wherein the RF pulse sequence is a spin echo or a fast spin echo.

16. The MRI apparatus as recited in claim 10, wherein an excitation RF pulse to acquire the FID signal is a 90° RF pulse, and the refocusing RF pulse is 180° RF pulse.

17. The MRI apparatus as recited in claim 10, wherein the predetermined area is a 2D cross-section of the subject or a 3D sub volume.

18. The MRI method as recited in claim 1, further comprising determining whether the RF pulse sequence is completely applied to generate the magnetic resonance image of the predetermined area, and in response to a negative determination, using the same acquired resonance frequency to generate an excitation RF pulse in a next section of the RF pulse sequence.

* * * * *